(12) United States Patent
Shiner

(10) Patent No.: US 11,889,648 B2
(45) Date of Patent: Jan. 30, 2024

(54) SYSTEM AND METHOD FOR THE DESIGN, CONFIGURATION, AND INSTALLATION OF AN IN-CEILING AUDIO-VIDEO EQUIPMENT HOUSING

(71) Applicant: Crestron Electronics, Inc., Rockleigh, NJ (US)

(72) Inventor: Paul Shiner, Rockleigh, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 405 days.

(21) Appl. No.: 16/502,861

(22) Filed: Jul. 3, 2019

(65) Prior Publication Data
US 2020/0093019 A1    Mar. 19, 2020

Related U.S. Application Data

(60) Provisional application No. 62/694,521, filed on Jul. 6, 2018.

(51) Int. Cl.
*E04B 9/00*  (2006.01)
*H05K 7/14*  (2006.01)

(52) U.S. Cl.
CPC ............. *H05K 7/14* (2013.01); *E04B 9/003* (2013.01)

(58) Field of Classification Search
None
See application file for complete search history.

(56) References Cited

U.S. PATENT DOCUMENTS

| | | | |
|---|---|---|---|
| 6,265,984 B1 * | 7/2001 | Molinaroli | H05B 47/155 340/815.45 |
| 9,200,784 B2 * | 12/2015 | Mandy | F21V 17/002 |
| 9,370,117 B2 * | 6/2016 | Franck | H05K 7/14 |
| 9,686,874 B2 * | 6/2017 | Jeon | H04N 5/655 |
| 9,807,496 B1 * | 10/2017 | Hecht | H04R 1/2826 |
| 9,813,806 B2 * | 11/2017 | Graham | H04R 3/005 |
| 9,894,788 B2 * | 2/2018 | Alexander | H05K 7/1455 |
| 9,972,887 B1 * | 5/2018 | Feiner | H01Q 1/2291 |
| 10,021,807 B2 * | 7/2018 | Franck | H05K 7/18 |
| 10,057,551 B2 * | 8/2018 | Lara | H04R 5/02 |
| 10,501,936 B2 * | 12/2019 | Rimmer | E04B 9/006 |
| 2008/0010907 A1 * | 1/2008 | Moench | E04B 9/006 52/28 |
| 2010/0181141 A1 * | 7/2010 | Olds | H04R 1/025 181/199 |
| 2010/0187370 A1 * | 7/2010 | Parigoris | E04B 9/006 52/741.1 |
| 2011/0280432 A1 * | 11/2011 | Tracy | H04R 1/02 381/395 |

(Continued)

*Primary Examiner* — Xanthia C Cunningham
(74) *Attorney, Agent, or Firm* — Crestron Electronics, Inc

(57) ABSTRACT

Disclosed herein is a system and method for installing a set of electronic equipment in an enterprise location, the method comprising: specifying one or more functional operations for the set of electronic equipment to perform within the enterprise location; installing a set of electronic equipment in a mechanical housing, the mechanical housing adapted to be installed in a suspended ceiling in place of one or more ceiling tiles; and configuring each of the one or more separate pieces of electronic equipment that make up the set of electronic equipment such that upon installation in the suspended ceiling, the set of electronic equipment operates and communicates in the manner as specified.

6 Claims, 4 Drawing Sheets

(56) References Cited

U.S. PATENT DOCUMENTS

| | | | |
|---|---|---|---|
| 2011/0299290 A1* | 12/2011 | Mandy | F21V 21/047 362/366 |
| 2013/0321715 A1* | 12/2013 | Millson | F16M 11/048 52/27 |
| 2014/0063810 A1* | 3/2014 | Randolph | F21V 7/0091 362/294 |
| 2014/0357177 A1* | 12/2014 | Stewart, Jr. | F16M 13/027 454/258 |
| 2015/0049452 A1* | 2/2015 | Franck | H05K 7/14 220/3.3 |
| 2017/0001726 A1* | 1/2017 | Claflin | B64D 47/02 |

* cited by examiner

SYSTEM AND METHOD FOR THE DESIGN, CONFIGURATION, AND INSTALLATION OF AN IN-CEILING AUDIO-VIDEO EQUIPMENT HOUSING

PRIORITY INFORMATION

The present application claims priority under 35 U.S.C. § 119(e) to U.S. Provisional Patent Application Ser. No. 62/694,521, filed Jul. 6, 2018, the entire contents of which are expressly incorporated herein by reference.

BACKGROUND OF THE INVENTION

Technical Field

The embodiments described herein relate generally to housing systems for audio, video, and other electronic equipment, and more specifically to systems, methods, and modes for the design, configuration, and installation in a suspended ceiling in an enterprise location of an electronic equipment housing assembly.

Background Art

There are many locations in which installation of racks and rack-mounted audio-video equipment occur either within the rooms, or in equally inconvenient equipment rooms. When installed in the room, such as a classroom, the racks are generally large, obtrusive, and unsightly. In addition, while generally not dangerous, there is always the risk of small hands getting into places that they do not belong. Such racks take up valuable floor space that could otherwise be used for another desk or a place to located other equipment actually useful in a classroom (or board room, or other meeting room). In addition to the equipment and the rack themselves, there are also the cables that need to be connected between the equipment, and between the equipment and other AV equipment in the room (displays, speakers, among others). In addition, conduit is need to protect and organize the cables.

As those of skill in the art, and others, can readily appreciate, such rack mounted systems are aesthetically unappealing, and expensive. They also can require re-wiring of the rooms, and their presence means the loss of expensive and needed floor space.

Accordingly, a need has arisen for systems, methods, and modes for the design, configuration, and installation in a suspended ceiling in an enterprise location of an electronic equipment housing assembly.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for the design, configuration, and installation in a suspended ceiling in an enterprise location of an electronic equipment housing assembly that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, a method is provided for installing a set of electronic equipment in an enterprise location, the method comprising: specifying one or more functional operations for the set of electronic equipment to perform within the enterprise location; installing a set of electronic equipment in a mechanical housing, the mechanical housing adapted to be installed in a suspended ceiling in place of one or more ceiling tiles; and configuring each of the one or more separate pieces of electronic equipment that make up the set of electronic equipment such that upon installation in the suspended ceiling, the set of electronic equipment operates and communicates in the manner as specified.

According to the first aspect of the embodiments, the method further comprises: interconnecting the set of electronic equipment with additional equipment in the enterprise location.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
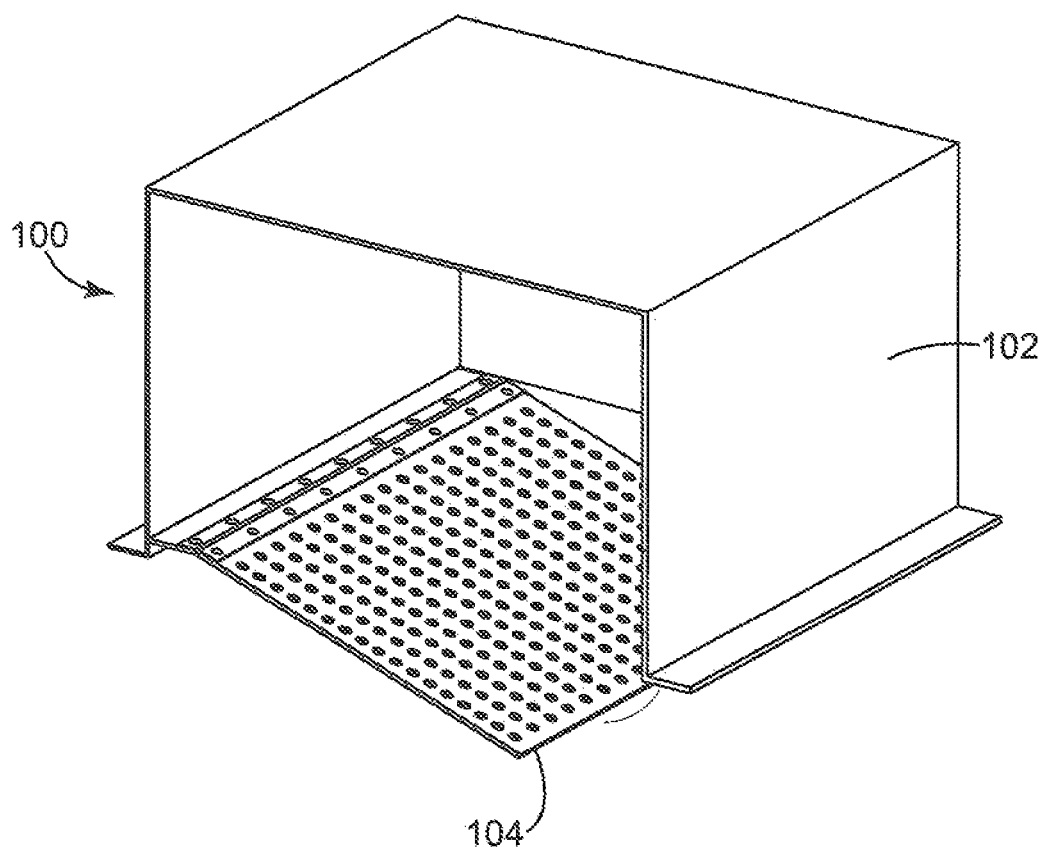
FIG. 1 illustrates a diagram of a pre-configured in-ceiling mounted electronics equipment housing according to aspects of the embodiments.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as ceiling-based speaker systems, which include full and half ceiling panel speaker systems that are variably tunable and acoustically impedance matched.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics can be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
100 Pre-configured In-Ceiling Mounted Electronics Equipment Housing (Equipment Housing)
102 Main Housing Part
104 Door
106 Audio Video Equipment
108 Key Lock
110 Spring Latch The different aspects of the embodiments described herein pertain to the context of a ceiling-based equipment housing systems, which include pre-packaged, pre-configured electronics, generally in the context of the educational market, but is not limited thereto, except as may be set forth expressly in the appended claims.

For 40 years Creston Electronics Inc. has been the world's leading manufacturer of advanced control and automation systems, innovating technology to simplify and enhance modern lifestyles and businesses. Crestron designs, manufactures, and offers for sale, integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein, as embodied as equipment housing system 100 can be manufactured by Crestron Electronics Inc., located in Rockleigh, NJ.

Figure 2:
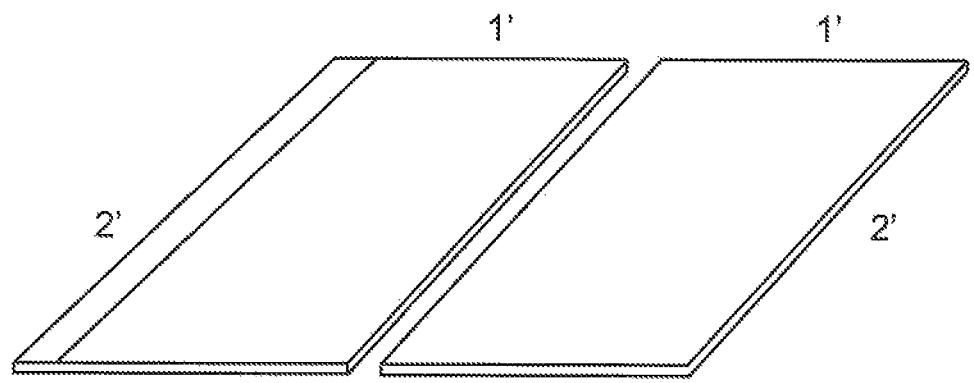
FIG. 2 illustrates a typical configuration of a ceiling tile into which one example of pre-configured in-ceiling mounted electronics equipment housing according to aspects of the embodiments can be inserted into, according to aspects of the embodiments.
Figure 3:
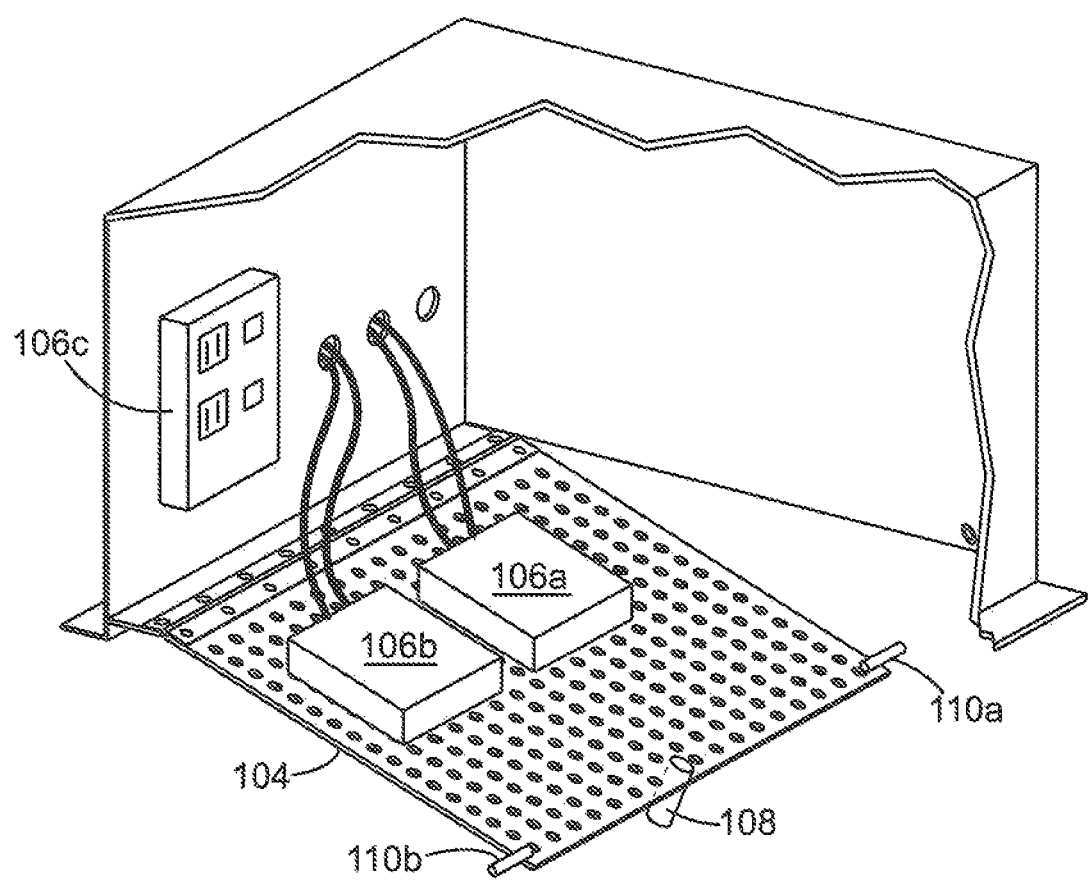
FIG. 3 illustrates a detailed view of electronics and other apparatus located inside the housing of the pre-configured in-ceiling mounted electronics equipment housing according to aspects of the embodiments.
Figure 4:
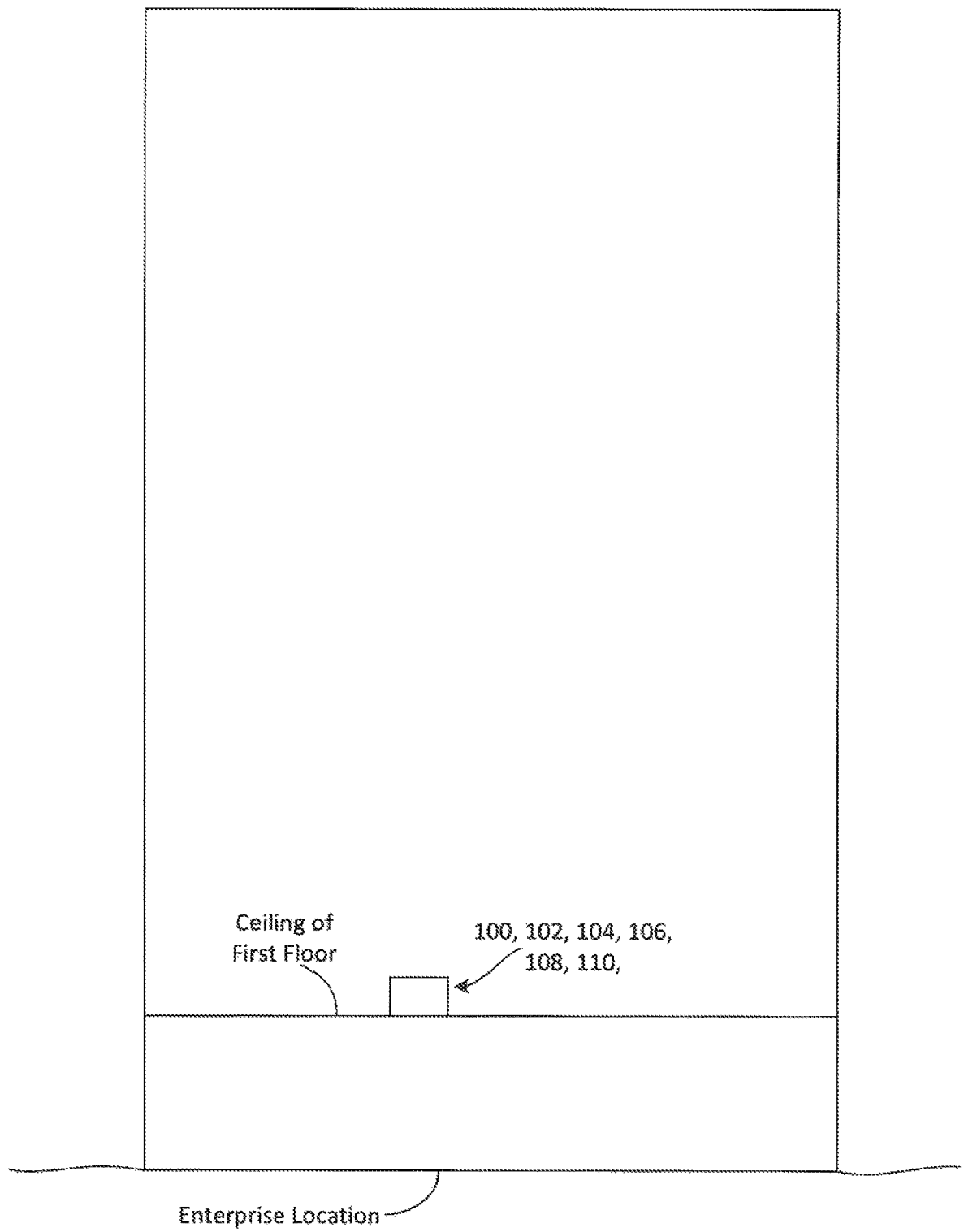
FIG. 4 illustrates a partial cut-away view of an enterprise location with the pre-configured in-ceiling mounted electronics equipment housing as shown in FIG. 1 according to aspects of the embodiments.

Attention is now directed towards FIGS. 1-4. FIG. 1 illustrates a diagram of pre-configured in-ceiling mounted electronics equipment housing 100 according to aspects of the embodiments, FIG. 2 illustrates a typical configuration of a ceiling tile into which one example of pre-configured in-ceiling mounted electronics equipment housing 100 according to aspects of the embodiments can be inserted into, according to further aspects of the embodiments, and FIG. 3 illustrates a detailed view of electronics and other apparatus located inside the housing of the pre-configured in-ceiling mounted electronics equipment housing 100 (in-ceiling mounted equipment housing) system 100 according to aspects of the embodiments. FIG. 4 illustrates a partial cut-away view of an enterprise location with the pre-configured in-ceiling mounted electronics equipment housing 100 as shown in FIG. 1 according to aspects of the embodiments. As those of skill in the art can appreciate, many enterprise locations include rooms that have suspended ceiling assemblies. Such suspended ceiling assemblies include T-bar stringers. T-bar stringers are used to provide rigidity as well as to facilitate placement of ceiling tiles within a suspended ceiling system. As those of skill in the art can appreciate, installers will locate fasteners, or some other similar mechanical device, in the upper ceiling (usually the joists) where the suspended ceiling is to be installed. Wire is connected to the fasteners, and then to the T-bar stringer such that it is located at the correct height, substantially level with the adjoining and adjacent mineral-fiber ceiling tiles (in addition, most ceiling tiles exhibit acoustic dampening characteristics). T-bar stringers facilitate secure placement of in-ceiling mounted equipment housing system 100 because in some cases, in-ceiling mounted equipment housing system 100 is 1 foot-by-two feet in dimension, which is one-half of a standard ceiling tile, and thus support is needed for the remaining ceiling tile and in-ceiling mounted equipment housing system 100 according to aspects of the embodiments.

The in-ceiling mounted equipment housing system 100 according to aspects of the embodiments can house or include devices for a the support of a local room that can include audio processors, audio amplifiers, video routers/switchers, sensors and related safety/monitoring devices, and network cabling/information technology (IT) components, among other devices, and wherein all such devices are pre-ordered, pre-packaged, and pre-configured in the housing prior to installation in a suspended ceiling assembly according to aspects of the embodiments. As those of skill in the art can appreciate, reasons for installing such equipment in a suspended ceiling system can include available space utilization and equipment security. An in-ceiling installation does not occupy floor space or dedicated equipment closets. The in-ceiling location is out-of-the way, physically locked/secure, and is less likely to be of interest for unauthorized access.

According to further aspects of the embodiments, another aspect of an in-ceiling installation results from the form factor of the equipment installed in it. The Electronic Industries Association (EIA) publishes specifications for equipment in floor and wall mounted racks in standard 19" widths and 1.75" height increments; depth is non-standard.

According to further aspects of the embodiments, use of in-ceiling mounted equipment housing system 100 can locate Crestron and third party components in a ceiling mounted box that optimizes space, and fits more system capability into the smallest space possible, and all within easy reach for service and updates. According to still further aspects of the embodiments, use of in-ceiling mounted equipment housing system 100 places the components out of the way and beyond the reach of the occupants of the room. According to still further aspects of the embodiments, use of in-ceiling mounted equipment housing system 100 can lower the delivery cost of an electronics system versus adding a room rack or dedicating space in an equipment closet. According to still further aspects of the embodiments, use of in-ceiling mounted equipment housing system 100 means there is substantially no need for additional conduit installations to home-run cabling to remote closets. According to still further aspects of the embodiments, use of in-ceiling mounted equipment housing system 100 substantially secures the pre-packaged, pre-configured equipment with an in-room location that is out of reach from occupants. According to still further aspects of the embodiments, use of in-ceiling mounted equipment housing system 100 provides a full suit of desired electronic equipment that has already been configured and tested to operate together prior to shipping from the vendor; that is, upon ordering of one or more of audio, video, sensor, and communications equipment, among other items, such devices are pre-packaged, and then pre-configured so that each will be tested for communications and processing capabilities, as if they were already installed on location, in essence meaning that there is substantially little chance for the devices, upon installation, not to work together or with other devices in the enterprise use location as all such communications, testing and use has already been performed and verified, according to aspects of the embodiments. According to further aspects of the embodiments, in-ceiling mounted equipment housing system 100 can be either 1'×2' (one half of a standard ceiling tile), 2'×2' (full standard ceiling tile), or some other size.

Referring to FIGS. 1 and 3, in-ceiling mounted equipment housing system 100 includes main housing part 102, door 104 (attached to main housing part 102 via a "piano" hinge, or some other suitable rotating attaching mechanism), equipment 106a-c (fewer or more pieces of equipment can be installed, as those of skill in the art can appreciate), key lock 108, and spring pin latches 110a,b. Equipment 106 is mounted in and on interior surfaces of main housing part 102, as well as on door 104, as shown in FIGS. 1 and 3. Cutouts can be included to allow cabling to enter main housing part 102, also as shown in FIG. 1. Main housing part 102 has lips that fit with T-bar stringers to facilitate secure placement within a space where a fiber-board ceiling tile would otherwise be located. On door 104 are key lock 108, and spring pin latches 110a,b, the operation of all of which are well known to those of skill in the art.

This application may contain material that is subject to copyright, mask work, and/or other intellectual property protection. The respective owners of such intellectual property have no objection to the facsimile reproduction of the disclosure by anyone as it appears in published Patent Office file/records, but otherwise reserve all rights.

The disclosed embodiments provide a systems, methods, and modes for the design, configuration, and installation in a suspended ceiling in an enterprise location of an electronic equipment housing assembly. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

Industrial Applicability

To solve the aforementioned problems, the aspects of the embodiments are directed towards systems, methods, and modes for the design, configuration, and installation in a suspended ceiling in an enterprise location of an electronic equipment housing assembly.

Alternate Embodiments

Alternate embodiments may be devised without departing from the spirit or the scope of the different aspects of the embodiments.

What is claimed is:

1. A method for installing a set of audio video electronic equipment in an enterprise location, the method comprising:
   specifying one or more functional operations for the set of audio video electronic equipment to perform within the enterprise location;
   pre-configuring the specified set of audio video electronic equipment prior to shipping and installation, such that the set of audio video electronic equipment performs as specified when installed;
   installing the set of audio video electronic equipment in a mechanical housing, the mechanical housing adapted to be installed in a suspended ceiling in place of one or more ceiling tiles; and
   testing the set of audio video electronic equipment following installation in the suspended ceiling to verify that the set of audio video electronic equipment operates and communicates in the manner as specified.

2. The method according to claim 1, further comprising:
   interconnecting the set of audio video electronic equipment with additional equipment in the enterprise location.

3. An apparatus for housing electronic audio-video devices to be installed in an enterprise location, comprising:
   a set of audio video electronic equipment that are specified, pre-configured, and tested prior to installation to perform one or more functional operations within the enterprise location; and
   a mechanical housing within which the set of audio video electronic equipment can be installed, the mechanical housing adapted to be installed in a suspended ceiling in place of one or more ceiling tiles, and wherein, once such installation within the suspended ceiling occurs, each of
the one or more separate pieces of audio video electronic equipment that make up the set of audio video electronic equipment operate and communicate in the manner as specified.

4. The apparatus according to claim 3, wherein
the set of audio video electronic equipment are interconnected with additional equipment in the enterprise location.

5. The method according to claim 1, wherein the step of pre-configuring comprises:
specifying the audio video electronic equipment to operate and communicate in a particular manner as to an intended installation location; and
testing the specified audio video electronic equipment prior to installation to ensure that the audio video equipment, upon installation, will operate and communicate in the manner specified, by itself and/or with other electronic equipment already located in the installation location.

6. The apparatus according to claim 3, wherein the set of a set of audio video electronic equipment that are specified, pre-configured, and tested prior to installation to perform one or more functional operations within the enterprise location further comprises:
audio video electronic equipment are specified to operate and communicate in a particular manner as to an intended installation location; and
the audio video electronic equipment are tested prior to installation to ensure that the audio video equipment, upon installation, will operate and communicate in the manner specified, by itself and/or with other electronic equipment already located in the installation location.

* * * * *